United States Patent
Sparks et al.

(10) Patent No.: US 7,544,605 B2
(45) Date of Patent: Jun. 9, 2009

(54) METHOD OF MAKING A CONTACT ON A BACKSIDE OF A DIE

(75) Inventors: Terry G. Sparks, Austin, TX (US); Shahid Rauf, Pleasanton, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 206 days.

(21) Appl. No.: 11/562,161

(22) Filed: Nov. 21, 2006

(65) Prior Publication Data

US 2008/0119046 A1    May 22, 2008

(51) Int. Cl.
*H01L 21/20* (2006.01)

(52) U.S. Cl. .................. 438/622; 438/629; 438/637; 438/638; 438/639; 257/E21.577; 257/E21.586; 257/E21.597

(58) Field of Classification Search ............ 438/622, 438/629, 637–639, 667, 687; 257/E21.577, 257/580, 597
See application file for complete search history.

(56) References Cited

U.S. PATENT DOCUMENTS

| | | | |
|---|---|---|---|
| 5,998,292 A | 12/1999 | Black et al. | |
| 6,841,469 B2 * | 1/2005 | Sawada et al. | 438/629 |
| 6,943,067 B2 | 9/2005 | Greenlaw | |
| 6,984,571 B1 | 1/2006 | Enquist | |
| 7,129,114 B2 * | 10/2006 | Akram | 438/110 |
| 2005/0067620 A1 | 3/2005 | Chan et al. | |
| 2006/0027934 A1 * | 2/2006 | Edelstein et al. | 257/774 |
| 2008/0113505 A1 * | 5/2008 | Sparks et al. | 438/637 |

FOREIGN PATENT DOCUMENTS

EP    0073487 B1    7/1988

OTHER PUBLICATIONS

International Search Report for correlating PCT Patent Application No. PCT/US 07/79727 dated Mar. 27, 2008.
Chang et al; "A Highly manufacturable 0.25um Multiple-Vt Dual gate Oxide CMOS Process for Logic/Embedded IC Foundry Technology"; 1998 Symposium on VLSI Technology Digest of Technical Papers; 1998 IEEE.

(Continued)

*Primary Examiner*—Michael S Lebentritt
(74) *Attorney, Agent, or Firm*—James L. Clingan, Jr.; Kim-Marie Vo

(57) ABSTRACT

A method of forming a semiconductor device includes forming active circuitry over a semiconductor substrate, wherein the semiconductor substrate has a first major surface and a second major surface and the first active circuitry is formed over the first major surface of the semiconductor substrate. A via is formed within the first semiconductor substrate, wherein the via extends from the first active circuitry to the second major surface of the first semiconductor substrate. A dielectric layer is formed over the second major surface and adjacent the first via. The dielectric layer may include nitrogen and silicon and may be formed by a low pressure, low temperature, or both plasma process.

20 Claims, 2 Drawing Sheets

OTHER PUBLICATIONS

Sekine et al; "High-integrity Ultra-thin Silicon Nitride Film Growth at Low temperature for Extending Scaling Limit of Gate Dielectric"; 1999 Symposium on VLSI Technology Digest of Technical Papers; 1999 IEEE.

Sekine et al; "Highly Robust Ultrathin Silicon Nitride Films Grown at Low-Temperature by Microwave-Excitation High-Density Plasma for Giga Scale Integration"; IEEE Transactions on Electron Devices, vol. 47, No. 7, Jul. 2000.

Moslehi et al; "Thermal Nitridation of Si and SiO2 for VLSI"; IEEE Transactions on Electron Devices, vol. ED-32, No. 2, Feb. 1985.

* cited by examiner

METHOD OF MAKING A CONTACT ON A BACKSIDE OF A DIE

FIELD OF THE INVENTION

The present invention relates generally to integrated circuits, and more particularly, to forming a contact on a backside of a die.

BACKGROUND OF THE INVENTION

Stacking of integrated circuits has long been an available technique for increasing functionality for a given amount of space. For example, this has been a technique for doubling the amount of memory by stacking two memory integrated circuits. It has now become more desirable to used stacked integrated circuits that are of a different type not just because of the increased density available without requiring a single die, but also because of the different manufacturing techniques used for the different functions. For example, rf circuits often needed to be used in conjunction with logic circuits but the manufacturing techniques are quite different for these different functions. Thus, it is more practical to stack these two functions than try to achieve them both on the same integrated circuit. In stacking die, issues arise relating to the interconnection between die that are not present with regard to a single die. One example is that it is helpful when stacking die to have a contact on the backside, the side opposite of where the circuitry is formed, of the die.

Therefore, what is needed is an improved method for manufacturing a die with a backside contact.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a die has active circuitry on one side and contact on the other side that are useful for interconnecting to another die. The contacts are formed on bottom surfaces of vias that are exposed by a grinding operation on the backside of the die. The vias extend from the active circuitry into a semiconductor substrate. After the grinding operation, there are exposed vias surrounded by semiconductor material, typically silicon. In order to protect and insulate the semiconductor material, the bottom surface of the semiconductor material has an insulating layer formed by selective deposition. A particularly effective technique is growing silicon nitride which does not grow on the via. Because of the material of the via, the exposed bottom surface is not at all conducive to growing a film with the chemistry used to grow silicon nitride on the substrate. With the semiconductor material protected, plating of the exposed via is performed resulting in the desired contact without requiring a step of removing the insulating material over the via because the insulating material was never covering the via. This is better understood by reference to the drawings and the following description.

The following is intended to provide a detailed description of an example of the invention and should not be taken to be limiting of the invention itself. Rather, any number of variations may fall within the scope of the invention, which is defined in the claims following the description.

Figure 1:
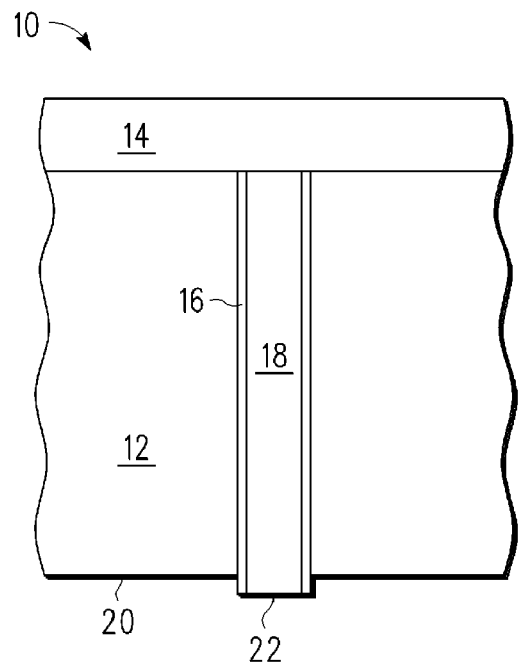
FIG. 1 is a cross section of a portion of a die at a step in a method of an embodiment.

Shown in FIG. 1 is a device 10 comprising a substrate 12, active circuitry 14 overlying substrate 12, and a hole from active circuitry 14 lined with an insulating layer 16 and filled with a via 18. Substrate 12 could be a semiconductor-on-insulator (SOI) substrate in which case there would also be an insulating layer present. A portion of active circuitry 14 is preferably formed in substrate 12 at a top surface thereof, but the portion could also be formed in a semiconductor layer or layers added to 12 substrate semiconductor layer. Active circuitry 14 also includes any interconnect layers needed to provide interconnections for active circuitry 14. In order to achieve device 10 as shown in FIG. 1, a grind step would preferably have been performed to result in a bottom surface 20 of substrate 12 being relatively thin, for example, 50 microns, compared to the common thickness of about 700 microns. This grinding step also exposes a bottom surface 22 of via 18. Thus, the hole in which via 18 is formed need not have penetrated substrate 12 the full 700 microns but only the amount needed to ensure that via 18 is exposed after the grind step. Insulator 16 is preferably oxide because it is conveniently deposited on the sidewall of the hole and can be of high quality. Via 18 is preferably copper but could be another conductive material. Bottom surface 20 of substrate 12 is shown slightly recessed from bottom surface 22 of via 18, which can be achieved by the grinding step because the substrate material of a difference in the removal rates. The bottom surface is also sometimes called the backside. The top and bottom surfaces of substrate 12 can also be called major surfaces.

Figure 2:
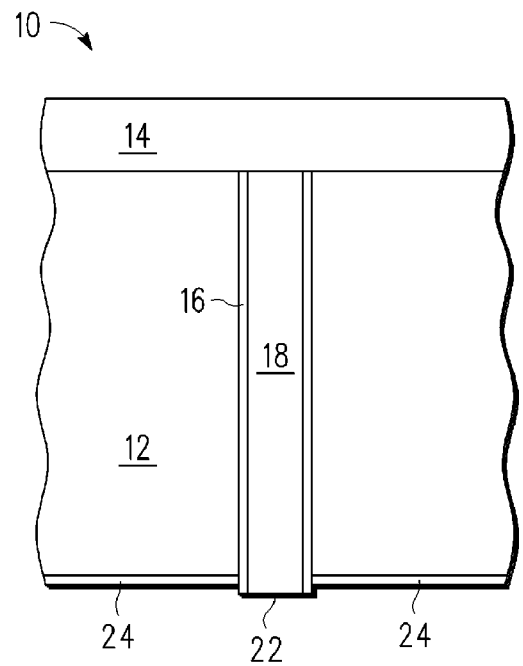
FIG. 2 is a cross section of the portion of the die of FIG. 1 at a subsequent step in the method.

Shown in FIG. 2 is device 10 after forming an insulating layer 24 by a selective process on bottom surface 20 of substrate 12. In this example substrate 12 is silicon and insulating layer 24 is formed by growing silicon nitride. The silicon nitride is not grown on bottom surface 22 of via 18. The silicon nitride is formed by a low pressure plasma. Preferably the ammonia ($NH_3$) is used because it not only avoids forming an unwanted film on bottom surface 22 it has a cleaning effect on bottom surface 22. Stoichiometric nitrogen ($N_2$) may also be used as well as possibly additional nitrogen-containing chemistries. It may be beneficial to accompany the nitrogen-containing gas with another gas. In the case of stoichiometric nitrogen, for example, argon and hydrogen are gases to consider adding. The thickness of silicon nitride as insulating layer 24 is preferably 20 to 100 Angstroms. During deposition, device 10 is preferably kept above 300 degrees Celsius but a lower temperature may be effective also. For the case of stoichiometric nitrogen and argon, an effective combination has been found to be 95% argon and 5% nitrogen at 50 milliTorr. For the case of stoichiometric nitrogen, argon, and hydrogen, an effective combination has been found to be 93% argon, 5% nitrogen, and 2% hydrogen at 50 milliTorr. Benefits of this nitrogen film include a breakdown voltage and low leakage.

Figure 3:
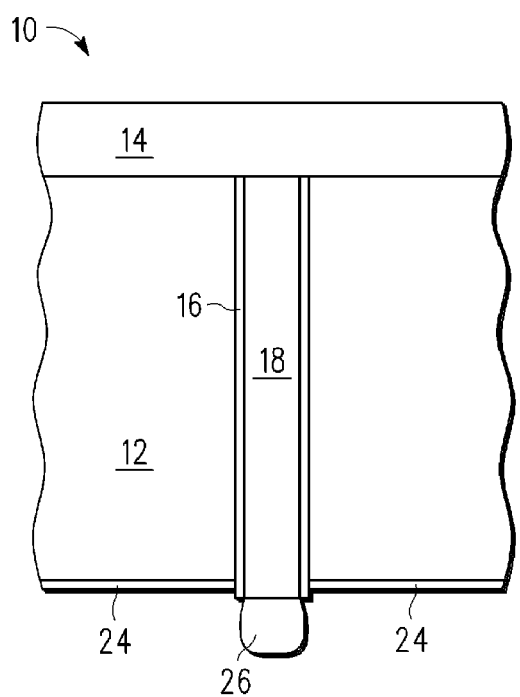
FIG. 3 is a cross section of the portion of the die of FIG. 2 at a subsequent step in the method.

Shown in FIG. 3 is device 10 after forming a contact 26 on bottom surface 22 of via 18. This is achieved by plating. Contact 26 is conveniently tin but other metals may also be plated onto via 18. In order to prepare for the plating there is no need to etch insulating layer 24 to expose via 18 for plating because insulating layer 24 was never over via 18 due to the selective deposition.

Figure 4:
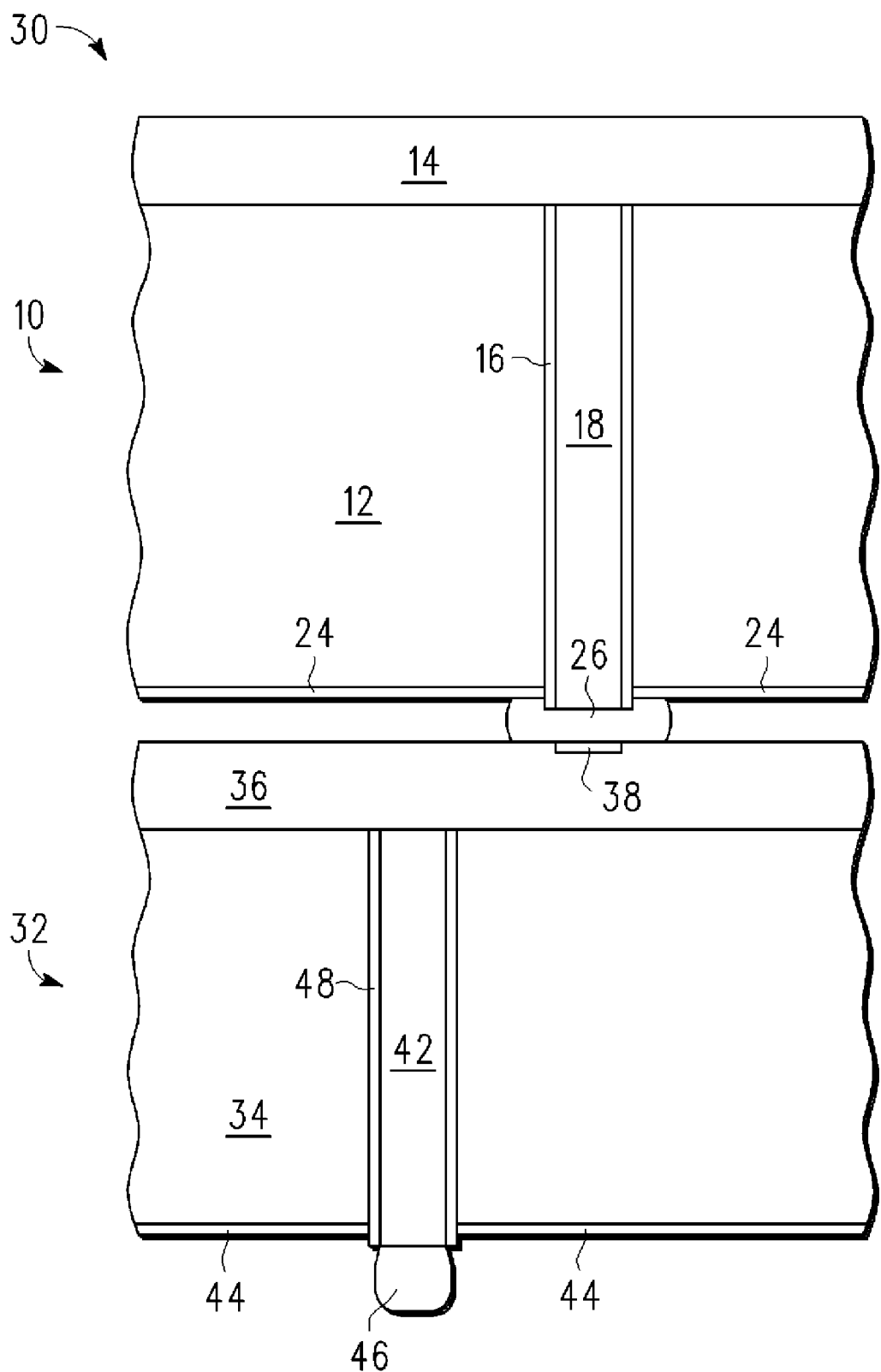
FIG. 4 is a cross section of the portion of the die of FIG. 3 connected to another die.

Shown in FIG. 4 is a multi-chip module 30 comprising device 10 and a device 32 connected to device 10. Device 32 is constructed similar to that of device 10 and has a substrate 34, active circuitry 36 overlying substrate 34, a via 42 of conductive material through a hole insulated by an insulating layer 40, a nitride layer 44 on the bottom of substrate 34, a contact 46 on the bottom of via 42, and a contact 38 in active circuitry 36 that is in contact with contact 26. Of course, in a completed integrated circuits there would be many more vias than just the ones, 18 and 42, shown for each of devices 10 and 32. It is not unusual for there to be several hundred inputs, outputs, and power supply terminals for a single integrated circuit.

Various other changes and modifications to the embodiments herein chosen for purposes of illustration will readily occur to those skilled in the art. For example, the embodiment reflected selective formation of silicon nitride on silicon in which the via was a metal such as copper by growing the silicon nitride. A different insulating material, however, may be able to be chosen based on its effectiveness in depositing on the substrate material while not depositing on the exposed via. Thus a selective process, that could be a deposition instead of a growth, that does not actually use up part of the substrate in forming the insulating layer, may be effective if it does not cause the via to be coated with an insulating material. The particular material chosen for the conductive via would need to be correlated with the substrate material to achieve the desired result. Examples were described to aid in understanding. Thus, it was not intended that these examples were the only examples. To the extent that such modifications and variations do not depart from the spirit of the invention, they are intended to be included within the scope thereof which is assessed only by a fair interpretation of the following claims.

The invention claimed is:

1. A method of forming a semiconductor device, the method comprising:
   forming first active circuitry over a first major surface of a first semiconductor substrate;
   forming a first via within the first semiconductor substrate, wherein:
      the first via extends from the first active circuitry to a second major surface of the first semiconductor substrate;
      the via comprises metal; and
      the second major surface comprises exposed semiconductor material; and
   growing a first dielectric layer on the exposed semiconductor material and adjacent the first via, wherein the growing avoids growing the first dielectric layer on the via.

2. The method of claim 1, wherein wherein the step of growing comprises selectively forming a dielectric layer comprising nitrogen and silicon.

3. The method of claim 1, wherein forming the first via within the first semiconductor substrate comprises:
   forming a trench within the semiconductor substrate;
   forming a conductive material within the trench; and
   removing a portion of the first semiconductor substrate to expose the conductive material, wherein removing the portion of the first semiconductor substrate to expose the conductive material comprises a process selected from the group consisting of planarization and etching.

4. The method of claim 1, wherein wherein the step of growing comprises:
   exposing the first semiconductor substrate to a plasma environment comprising nitrogen; and
   reacting the plasma with the first semiconductor substrate.

5. The method of claim 4, wherein the plasma environment comprises ammonia ($NH_3$).

6. The method of claim 5, wherein the plasma environment further comprises argon.

7. The method of claim 4, wherein the plasma environment comprises nitrogen and hydrogen.

8. The method of claim 4, wherein the reacting the plasma with the first semiconductor substrate occurs at a temperature greater than approximately 300 degrees Celsius.

9. The method of claim 8, wherein reacting the plasma with the first semiconductor substrate occurs at a pressure less than approximately 100 mTorr.

10. The method of claim 1, further comprising:
    forming a bump coupled to the conductive material after selectively forming the first dielectric layer.

11. The method of claim 10, further comprising:
    coupling the bump of the first semiconductor device to a second semiconductor device.

12. The method of claim 11, further comprising:
    forming second active circuitry over the second semiconductor substrate, wherein the second semiconductor substrate has a third major surface and a fourth major surface and the second active circuitry is formed over the third major surface of the second semiconductor substrate;
    forming a second via within the second semiconductor substrate, wherein the second via extends from the second active circuitry to the fourth major surface of the semiconductor substrate; and
    selectively forming a second dielectric layer over the fourth major surface, wherein:
       the second dielectric layer comprises nitrogen and silicon, and
       coupling the bump of the first semiconductor device to the second semiconductor device is performed after selectively forming the second dielectric layer.

13. A method of forming a semiconductor device, the method comprising:
    providing a semiconductor substrate, wherein the semiconductor substrate comprises active circuitry over the semiconductor substrate; and a via within the semiconductor substrate, wherein the via is exposed on a major surface of the semiconductor substrate and exposed semiconductor material is present on the major surface and surrounds the via; and
    growing a a silicon nitride layer on the exposed semiconductor material and adjacent the exposed via, wherein the growing avoids growing the silicon nitride layer on the via.

14. The method of claim 13, wherein selectively forming the dielectric layer comprises:
    exposing the semiconductor substrate to a plasma environment comprising nitrogen; and
    reacting the plasma with the semiconductor substrate.

15. The method of claim 14, wherein the plasma environment comprises ammonia ($NH_3$).

16. The method of claim 15, wherein the plasma environment further comprises argon.

17. The method of claim 14, wherein the plasma environment comprises nitrogen and hydrogen.

18. The method of claim 14, wherein the reacting the plasma with the semiconductor substrate occurs at a temperature greater than approximately 300 degrees Celsius.

19. The method of claim 18, wherein reacting the plasma with the semiconductor substrate occurs at a pressure less than approximately 100 mTorr.

20. A method of forming a semiconductor device, the method comprising:
providing a semiconductor substrate, wherein the semiconductor substrate comprises active circuitry over a semiconductor substrate; and a via of metal within the semiconductor substrate,
reducing the thickness of the semiconductor substrate to expose the via on a major surface of the semiconductor substrate and to provide exposed semiconductor material on the major surface; and
growing a dielectric layer on the exposed semiconductor material and adjacent the exposed via, wherein the dielectric layer comprises nitrogen and silicon and is not grown on the exposed via during the growing of the dielectric layer.

* * * * *